(12) United States Patent
Araki

(10) Patent No.: US 11,936,349 B2
(45) Date of Patent: Mar. 19, 2024

(54) AUDIO CIRCUIT, ELECTRONIC DEVICE AND VEHICLE AUDIO SYSTEM WITH THE AUDIO CIRCUIT

(71) Applicant: ROHM CO., LTD., Kyoto (JP)

(72) Inventor: Hideo Araki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 268 days.

(21) Appl. No.: 17/494,950

(22) Filed: Oct. 6, 2021

(65) Prior Publication Data

US 2022/0115997 A1 Apr. 14, 2022

(30) Foreign Application Priority Data

Oct. 9, 2020 (JP) ................. 2020-171242

(51) Int. Cl.
*H03F 3/217* (2006.01)
*H03F 1/02* (2006.01)

(52) U.S. Cl.
CPC ......... *H03F 3/2173* (2013.01); *H03F 1/0222* (2013.01); *H03F 2200/03* (2013.01); *H03F 2200/264* (2013.01); *H03F 2200/78* (2013.01)

(58) Field of Classification Search
CPC .... H03F 3/217; H03F 3/2173; H03F 2200/03; H03F 2200/264; H03F 3/181; H03F 2203/7212; H03F 2203/72; H03G 3/26; H03G 3/348
USPC .................. 330/251, 207 A, 207 P; 381/94.5
See application file for complete search history.

(56) References Cited

U.S. PATENT DOCUMENTS

2006/0023897 A1* 2/2006 Ginsberg ................ H03F 1/305
  381/94.8
2015/0071464 A1* 3/2015 Du ........................ H03F 3/2171
  381/94.5

FOREIGN PATENT DOCUMENTS

CN 106059507 A * 10/2016 ............. H03F 1/305
JP 2016111430 A 6/2016

* cited by examiner

*Primary Examiner* — Kile O Blair
(74) *Attorney, Agent, or Firm* — CANTOR COLBURN LLP

(57) ABSTRACT

The present disclosure provides an audio circuit capable of inhibiting a current when mute is deactivated. An output terminal of a class D amplifier circuit is connected to an electroacoustic conversion element through a low-pass filter. An output node of a bridge circuit is connected to the output terminal. An integrator integrates and outputs, in a non-mute period in which a mute control signal is negated, a difference between an input signal and a feedback signal corresponding to an output signal generated at the output terminal, and outputs a predetermined bias voltage in a mute period in which the mute control signal is asserted. A PWM comparator compares the output of the integrator with a periodic voltage. A driver switches, in the non-mute period, the bridge circuit according to an output of the PWM comparator, and fixes an output of the bridge circuit in the mute period.

14 Claims, 10 Drawing Sheets

AUDIO CIRCUIT, ELECTRONIC DEVICE AND VEHICLE AUDIO SYSTEM WITH THE AUDIO CIRCUIT

CROSS REFERENCE TO RELATED APPLICATIONS

The present invention claims priority under 35 U.S.C. § 119 to Japanese Application No. 2020-171242 filed Oct. 9, 2020, the entire content of which is incorporated herein by reference.

FIELD OF THE INVENTION

The disclosure relates to an audio amplifier circuit driving a speaker or a head-mounted earphone.

DESCRIPTION OF THE PRIOR ART

An efficient class D amplifier is used as a power amplifier that drives an electroacoustic conversion element such as a speaker or a head-mounted earphone. FIG. 1 shows a block diagram of an audio system 100S using a class D amplifier. The audio system 100S primarily includes an electroacoustic conversion element 102 such as a speaker or a head-mounted earphone, a low-pass filter (LPF) 104 and a class D amplifier circuit 900S.

An analog input audio signal Vin is inputted to the class D amplifier circuit 900S to generate a pulse signal PWMOUT having a duty cycle corresponding to the input signal Vin, and the pulse signal PWMOUT is outputted from an output terminal OUT. A high-frequency component higher than an audio frequency band is removed from the pulse signal PWMOUT at the low-pass filter 104, and a component of an audio frequency band is provided to the electroacoustic conversion element 102.

An integrator 910 integrates a difference between the input audio signal Vin and a feedback signal corresponding to the output pulse signal PWMOUT. A periodic voltage generating circuit 940 generates a periodic signal Vsaw having a pulse width-modulated carrier frequency. A pulse width modulation (PWM) comparator 920 compares an output Vintegout of the integrator 910 with the periodic signal Vsaw, and outputs a pulse signal COMPOUT.

An output section 930 includes a driver 932 and a half-bridge circuit (inverter circuit) 934. The driver 932 drives the half-bridge circuit 934 according to the pulse signal COMPOUT.

The class D amplifier circuit 900S has a mute function. The class D amplifier circuit 900S fixes the output pulse signal PWMOUT at a low voltage (0 V) in a mute period in which a mute control signal MUTE 15 asserted (for example, at a high level). Specifically, in the mute period, the driver 932 fixes a lower arm (a low-side transistor) of the half-bridge circuit 934 at a turned-on state, and fixes an upper arm (a high-side transistor) at a turned-off state.

PRIOR ART DOCUMENT

Patent Publication

[Patent publication 1] Japan Patent Publication No. 2016-111430

SUMMARY

Problems to be Solved by the Disclosure

The Inventor conducted research on the class D amplifier circuit 900S in FIG. 1, and discovered the following problem. FIG. 2 shows a waveform diagram of mute control of the class D amplifier circuit 900S in FIG. 1.

Before a timing t0, the mute control signal MUTE is at a high level, and the output pulse signal PWMOUT of the output section 930 is fixed at a low level. At this point in time, the output Vintegout of the integrator 910 is stabilized at a supply voltage (13 V).

At the timing t0, the mute control signal MUTE becomes a low level, and the mute state is deactivated. Within a brief moment after mute has just been deactivated, the output Vintegout of the integrator 910 deviates from a voltage range of the periodic signal Vsaw generated by the periodic voltage generating circuit 940, and becomes Vintegrate>Vsaw. Thus, the pulse signal COMPOUT is fixed at a high level, and the output pulse signal PWMOUT of the class D amplifier circuit 900S is also fixed at a high level (Vcc=13 V). When a direct-current (DC) high voltage Vcc is applied to the LPF 104, an extremely large current (surge current) flows through the high-side transistor of the half-bridge circuit 934 and an inductor of a filter to a capacitor of the LPF 104.

Patent publication 1 discloses mute control of the class D amplifier with a PWM input. In the technique above, a high current is suppressed by matching a logic level of the PWM input with an output of the class D amplifier in advance in a mute period. However, the technique cannot be applied to the class D amplifier with an analog input as shown in FIG. 1.

The disclosure is completed in view of the problem above. It is an illustrative object of one aspect of the disclosure to provide an audio circuit capable of inhibiting a current when mute is deactivated.

Technical Means for Solving the Problem

A class D amplifier circuit or an audio circuit having the class D amplifier circuit is provided according to an aspect of the disclosure. The class D amplifier circuit includes: an output terminal, to be connected to a filter; a bridge circuit, having an output node connected to the output terminal; an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted; a periodic voltage generating circuit, generating a periodic voltage of a triangular wave or sawtooth wave; a comparator, comparing an output of the integrator with the periodic voltage; and a driver, switching the bridge circuit according to an output of the comparator in the non-mute period, and fixing an output of the bridge circuit in the mute period.

A vehicle audio system is provided according to another aspect of the disclosure. The vehicle audio system includes: a speaker; a filter, having an output node connected to the speaker; and an audio circuit, having an output terminal connected to the filter. The audio circuit includes: the output terminal, to be connected to the filter; a bridge circuit, having an output node connected to the output terminal; an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted; a periodic voltage generating circuit, generating a periodic voltage of a triangular wave or sawtooth wave; a comparator, comparing an output of the integrator with the periodic voltage; and a driver, switching the bridge circuit according to an output of the comparator in the non-mute period, and fixing the output of the bridge circuit in the mute period.

Moreover, any combination of the elements above, and any implementation forms obtained by conversions between expressions of methods and devices of the disclosure may also effectively serve as implementation forms of the disclosure. Accordingly, the description of the item (Technical means for solving the problem) may not include all essential features of the disclosure, and therefore sub-combinations describing these features are also to be encompassed within the scope of the disclosure.

Effects of the Invention

An aspect of the disclosure is capable of inhibiting a current when mute is deactivated.

DETAILED DESCRIPTION OF THE INVENTION

Overview of Implementation Forms

Figure 1:
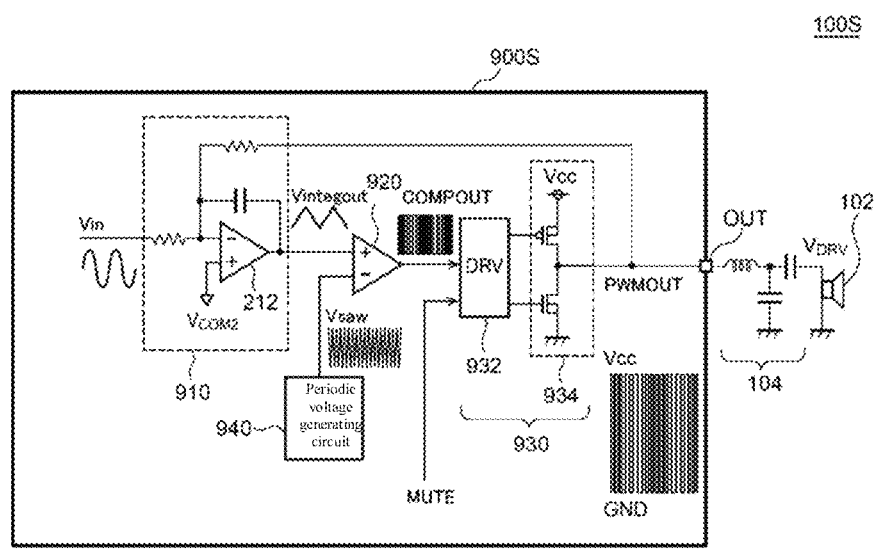
FIG. 1 is a block diagram of an audio system using a class D amplifier.
Figure 2:
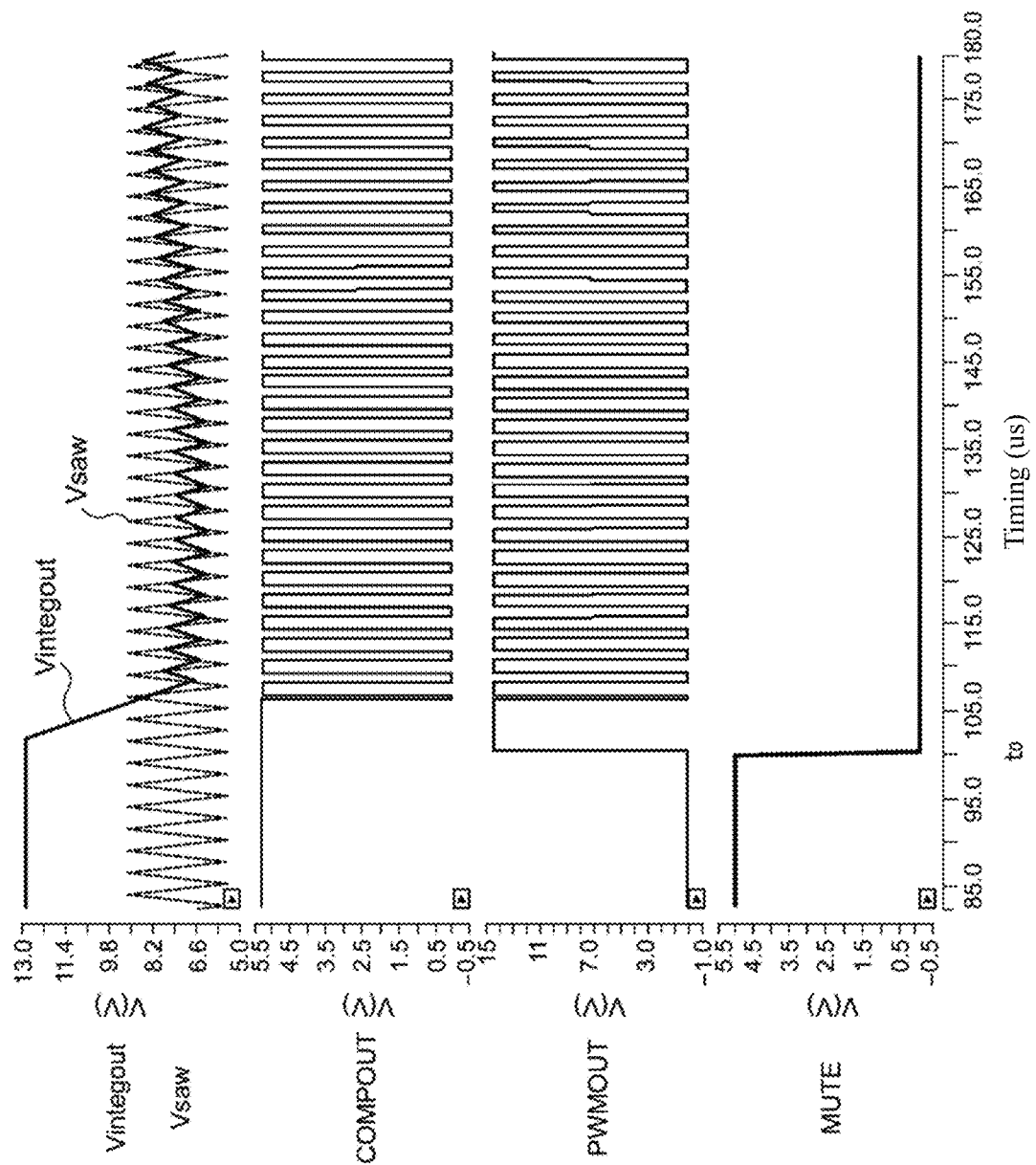
FIG. 2 is a waveform diagram of mute control of the class D amplifier circuit in FIG. 1.

The overview of several illustrative implementation forms of the disclosure is described below. The overview serves as the preamble of the following detailed description, and may be understood as several concepts of one or more implementation forms, so as to achieve the object of providing fundamental understanding of the implementation forms. It is to be noted that the overview does not pose limitations on the scope of the disclosure. Moreover, the overview does not take into account comprehensive overview of all possible implementation forms, and does pose limitations on essential constituting elements of the implementation forms. For the sake of better description, "one implementation form" sometimes refers to one implementation form (embodiment or variant embodiment) or multiple implementation forms (embodiments or variant embodiments) disclosed in the specification.

An audio circuit according to an embodiment includes a class D amplifier circuit. The class D amplifier circuit includes: an output terminal, to be connected to a filter; a bridge circuit, having an output node connected to the output terminal; an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted; a periodic voltage generating circuit, generating a periodic voltage of a triangular wave or sawtooth wave; a comparator, comparing an output of the integrator with the periodic voltage; and a driver, switching the bridge circuit according to an output of the comparator, and fixing an output of the bridge circuit in the mute period.

By setting a bias voltage within a voltage range (between a peak value and a valley value) of the periodic voltage in advance, the output of the comparator becomes a pulse signal having a duty cycle corresponding to the bias voltage in a mute period in which the mute control signal is asserted. Thus, the bridge circuit is immediately switched after mute is deactivated, so that the output of a direct-current (DC) voltage is prevented to thereby inhibit a large current.

In one embodiment, the integrator may include: an input node, receiving an input signal; an operational amplifier, having a non-inverting input node receiving a bias voltage; a first resistor, disposed between the input node and an inverting input node of the operational amplifier; a second resistor, disposed between the output terminal and the inverting input node of the operational amplifier; a capacitor, disposed between the inverting input node of the operational amplifier and an output node of the operational amplifier; and a switch, disposed and connected in parallel with the capacitor, turned off in the non-mute period and turned on in the mute period. Since the switch is turned on in the mute period, the integrator functions as a buffer (voltage follower), and so the output of the integrator can be fixed at the bias voltage.

In one embodiment, the input signal of the class D amplifier may be fixed in the mute period. A voltage level of the input signal in the mute period may be set according to a duty cycle of the output of the comparator.

In one embodiment, the bias voltage may be an intermediate voltage of a peak value and a valley value of the periodic voltage. Thus, in the mute period, the output of the comparator becomes a pulse signal having a 50% duty cycle.

In one embodiment, the class D amplifier circuit may be integrated at a substrate. The so-called "integrated" includes a situation in which all constituting elements of a circuit are formed on a substrate, or a situation in which main constituting elements of a circuit are integrated; alternatively, a part of resistors or capacitors may be disposed outside the substrate and be used to adjust circuit constants. By integrating circuits on one chip, the circuit area is reduced and characteristics of circuit elements are kept uniform.

In one embodiment, the audio circuit may include two of the class D amplifier circuit, and the two class D amplifier circuits are connected to an electroacoustic conversion element by means of bridge-tied load (BTL).

An electronic device according to an embodiment may include the class D amplifier circuit above.

A vehicle audio system according to an embodiment includes a speaker, a filter having an output node connected to the speaker, and an audio circuit. The audio circuit includes: an output terminal, to be connected to the filter; a bridge circuit, having an output node connected to the output terminal; an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted; a periodic voltage generating circuit, generating a periodic voltage of a triangular wave or sawtooth wave; a comparator, comparing an output of the integrator with the periodic voltage; and a driver, switching the bridge circuit according to an output of the comparator in the non-mute period, and fixing an output of the bridge circuit in the mute period.

Embodiments

Details of the preferred embodiments of the disclosure are specifically described with the accompanying drawings below. The same or equivalent constituting elements, parts and processes are represented by the same denotations, and repeated description is omitted as appropriate. Moreover, the embodiments are illustrative and are non-limiting to the disclosure. All features and combinations thereof described in the embodiments are not necessarily intrinsic characteristics of the disclosure.

In the specification, "a state in which a part A is connected to a part B" includes a situation in which the part A is directly connected to the part B, or a situation in which the part A is indirectly connected to the part B via another part, without the another part affecting the electrical connection state or hindering any functions.

Similarly, in "a state in which a part C is disposed between a part A and a part B", in addition to including situations in which the part A is directly connected to the part C, or the part B is directly connected to the part C, further includes a situation in which the part A is indirectly connected to the part C or the part B is indirectly connected to the part C via another part, without the another part affecting the electrical connection state or hindering any functions.

Figure 3:
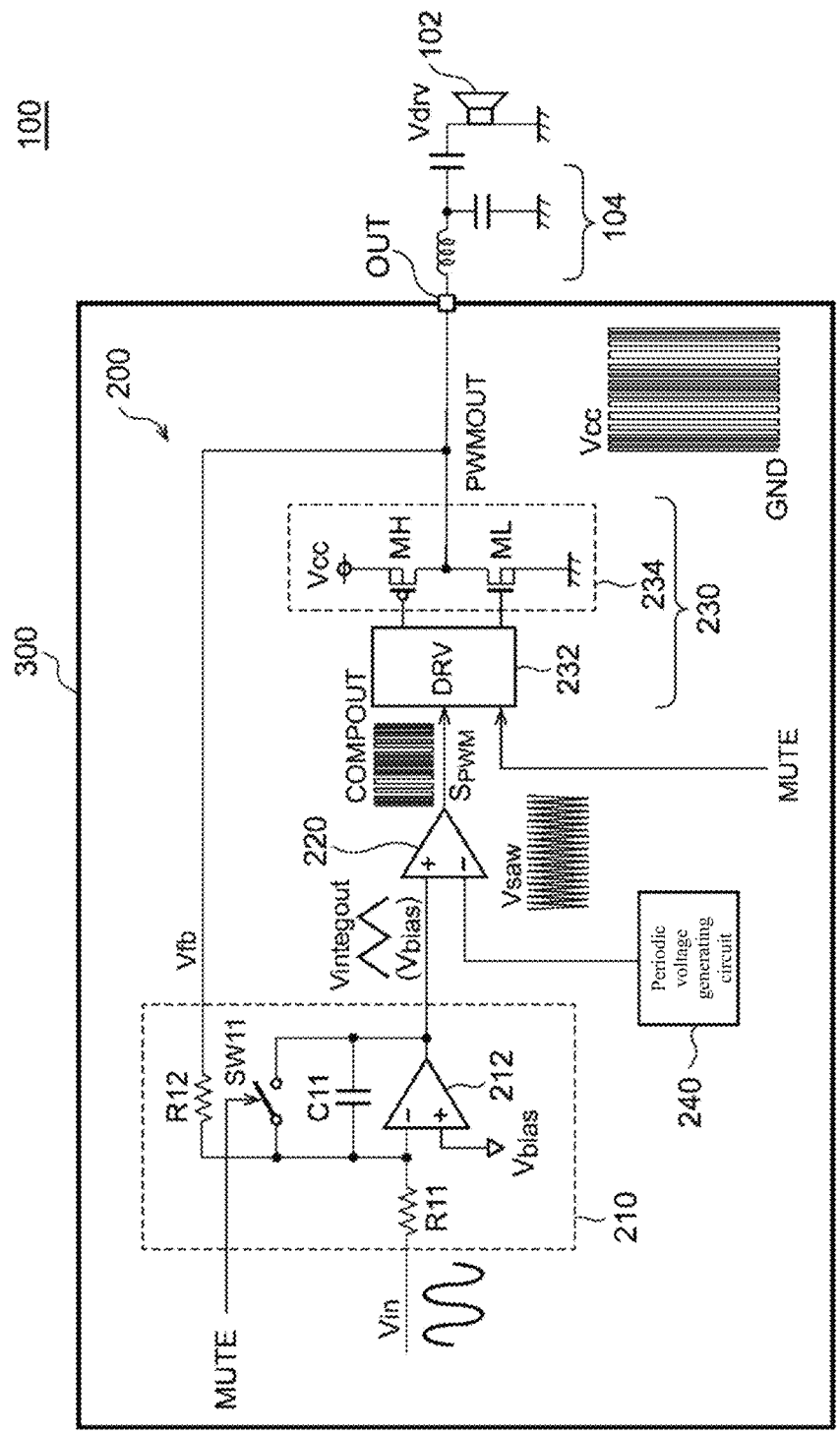
FIG. 3 is a block diagram of an audio system having an audio circuit according to an embodiment.

FIG. 3 show a block diagram of an audio system 100 having an audio circuit 300 according to an embodiment. The audio system 100 includes an electroacoustic conversion element 102, a low-pass filter (LPF) 104 and the audio circuit 300. The audio circuit 300 is a functional integrated circuit (IC) formed by integrating a class D amplifier circuit 200.

An output terminal OUT of the class D amplifier circuit 200 is connected to the LPF 104.

The class D amplifier circuit 200 converts an analog input signal Vin to a PWM signal PWMOUT, and outputs the PWM signal PWMOUT to an output terminal OUT. A high-frequency component of the PWM signal PWMOUT is removed by the LPF 104, and a driving signal Vdrv of an audio frequency band is provided to the electroacoustic conversion element 102.

The class D amplifier circuit 200 includes an integrator 210, a PWM comparator 220, an output section 230 and a periodic voltage generating circuit 240.

The output section 230 includes a driver 232 and a bridge circuit 234. The bridge circuit 234 is an inverter including a high-side transistor (upper arm) MH and a low-side transistor (lower arm) ML, and an output node thereof is connected to the output terminal OUT.

A mute control signal MUTE is inputted to the integrator 210. The mute control signal MUTE is asserted (for example, set to a high level) in the mute period, and is negated in a non-mute period. The integrator 210 integrates and outputs a difference between the input signal Vin and a feedback signal Vfb corresponding to the output signal PWMOUT generated at the output terminal OUT (that is, the output node of the class D amplifier circuit 200) in the non-mute period in which the mute control signal MUTE is negated (for example, set to a low level), and accordingly outputs an output voltage Vintegout. Moreover, the integrator 210 fixes the level of the output voltage Vintegout at a predetermined bias voltage Vbias in the mute period in which the mute control signal MUTE is asserted (for example, set to a high level).

The periodic voltage generating circuit 240 generates a periodic voltage Vsaw of a triangular wave or sawtooth wave. The bias voltage Vbias outputted by the integrator 210 in the mute period is set to be included within a voltage range of the periodic voltage Vsaw. For example, the bias voltage Vbias is an intermediate voltage of a peak value and a valley value of the periodic voltage Vsaw.

The PWM comparator 220 compares the output voltage Vintegout of the integrator 210 with the periodic voltage Vsaw, and outputs a pulse signal COMPOUT corresponding to the comparison result.

The mute control signal MUTE is also inputted to the driver 232. The driver 232 switches, in the non-mute period in which the mute control signal MUTE is negated, the bridge circuit 234 according to the output COMPOUT of the PWM comparator 220, and fixes the output of the bridge circuit 234 to a low level (grounded) in the mute period.

In this embodiment, the integrator 210 includes an operational amplifier (error amplifier) 212, a capacitor C11, a first resistor R11, a second resistor R12 and a switch SW11.

The input signal Vin is inputted to an input node of the integrator 210. The bias voltage Vbias is inputted to a non-inverting input node of the operational amplifier 212. The first resistor R11 is disposed between the input node and an inverting input node of the operational amplifier 212. The second resistor R12 is disposed between the output terminal OUT of the class D amplifier circuit 200 and the inverting input node of the operational amplifier 212. The capacitor C11 is disposed between the inverting input node of the operational amplifier 212 and an output node of the operational amplifier 212. The switch SW11 is disposed and connected in parallel with the capacitor C11. The mute control signal MUTE is inputted to the switch SW11; the switch SW11 is turned off in the non-mute period, and the switch SW11 is turned on in the mute period.

If the switch SW11 is turned on in the mute period, the operational amplifier 212 and the switch SW11 form a voltage follower circuit (buffer), and so the output voltage Vintegout becomes equal to the bias voltage Vbias.

Figure 4:
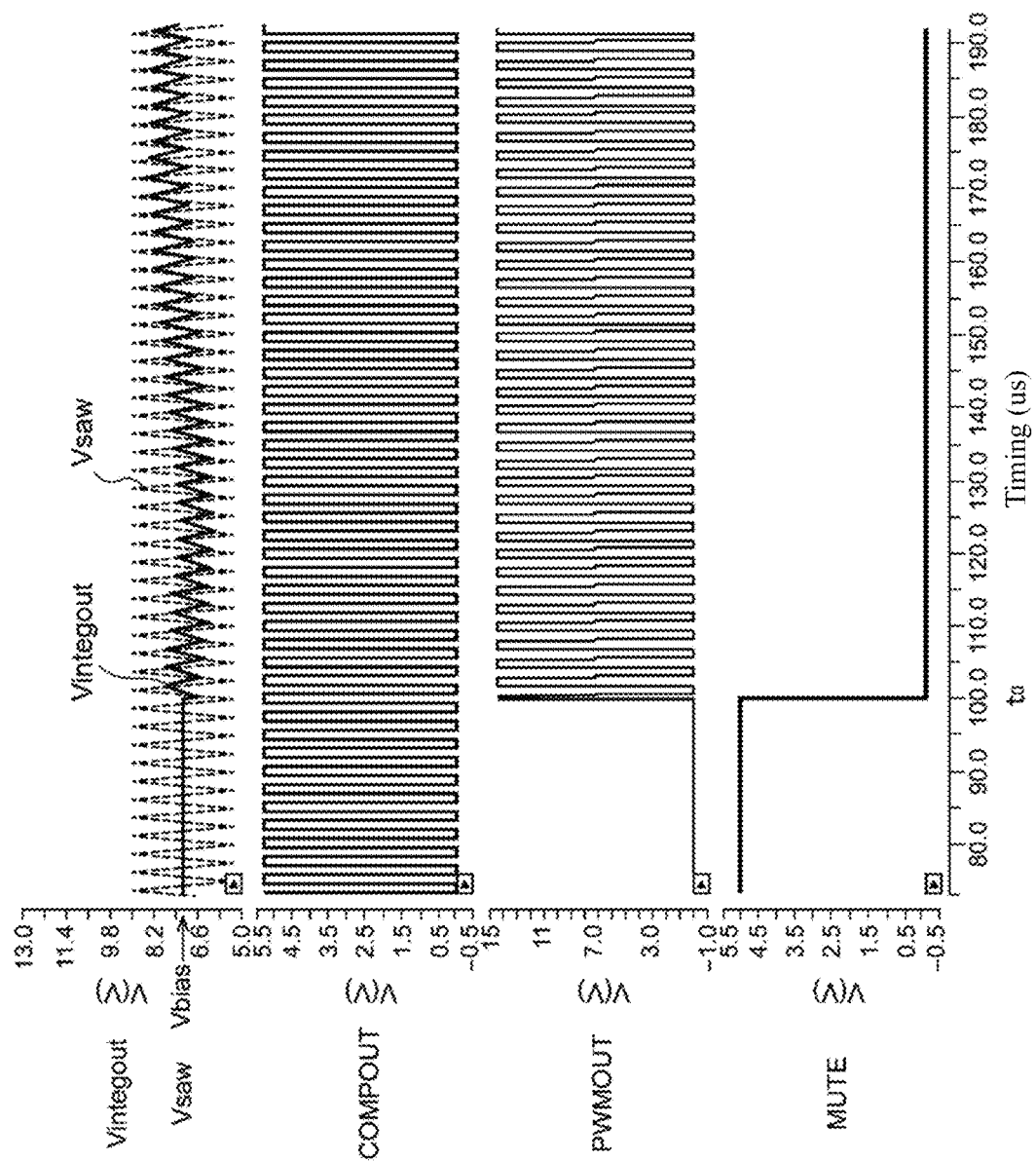
FIG. 4 is a waveform diagram of the operation of the audio circuit in FIG. 3.

The configuration of the audio circuit 300 is as described above. The operation of the audio circuit 300 is to be described below. FIG. 4 shows a waveform diagram of the operation of the audio circuit 300 in FIG. 3. Before a timing $t_0$, the mute control signal MUTE is at a high level (asserted), and a mute state is achieved. More specifically, the driver 232 fixes the high-side transistor MH at a turned off state, fixes the low-side transistor ML at a turned on state, and fixes the output signal PWMOUT at a low level. Moreover, in the mute period, the output voltage Vintegout of the integrator 210 is stabilized at the bias voltage Vbias. In this example, the bias voltage Vbias is an intermediate voltage of the periodic voltage Vsaw, and the duty cycle of the output COMPOUT of the PWM comparator 220 is 50%.

At the timing $t_0$, the mute control signal MUTE changes to a low level (negated), and the mute state is deactivated. Shortly after mute has been deactivated, the output voltage Vintegout of the integrator 210 is still included within the voltage range of the periodic voltage Vsaw, and so the output COMPOUT of the PWM comparator 220 becomes a pulse signal, and the output signal PWMOUT of the class D amplifier circuit 200 also becomes a pulse signal. Thus, the output signal PWMOUT of the class D amplifier circuit 200 is no longer stabilized at a high level (the supply voltage Vcc), and so a large current is inhibited from flowing in the capacitor of the LPF 104.

Then, the output voltage Vintegout of the integrator 210 starts to change according to the input signal Vin, and the output COMPOUT of the PWM comparator 220 and the duty cycle of the output signal PWMOUT of the class D amplifier circuit 200 then change according to the input signal Vin, and so an audio signal is played.

The configuration of the class D amplifier circuit 200 is as described above. The class D amplifier circuit 200 above is capable of inhibiting a current when mute is deactivated.

The configuration of the audio circuit 300 is to be described below.

Figure 5:
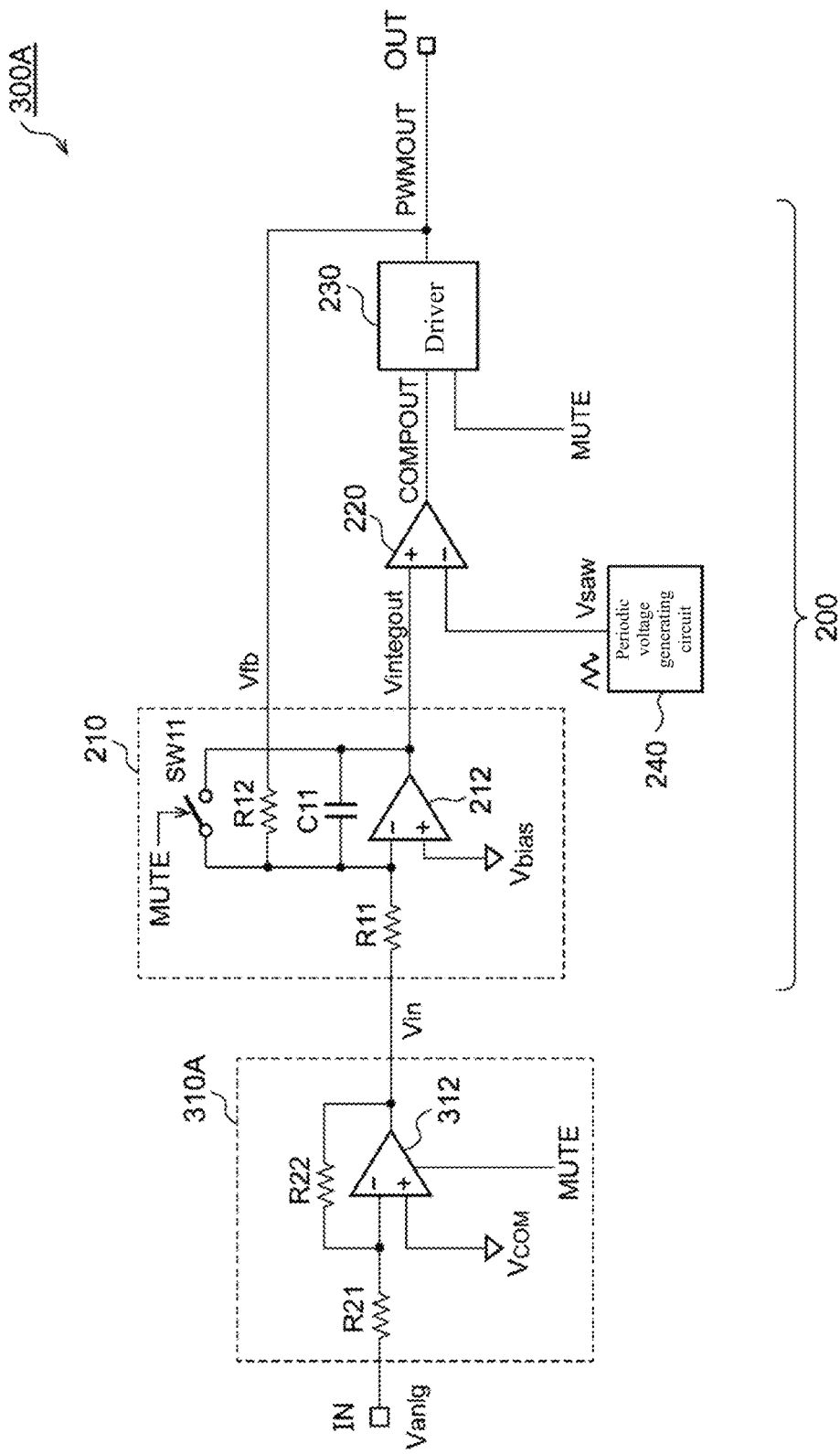
FIG. 5 is a circuit diagram of an audio circuit according to a first embodiment.

FIG. 5 shows a circuit diagram of an audio circuit 300A according to a first embodiment. In addition to the class D amplifier circuit 200, the audio circuit 300A further includes an input terminal IN and a front-end pre-amplifier 310A. An analog audio signal Vanlg is inputted to the input terminal IN from an external acoustic source (not shown). The pre-amplifier 310A amplifies the analog audio signal Vanlg, and provides the amplified input signal Vin to the class D amplifier circuit 200.

In the first embodiment, in addition to inputting the mute control signal MUTE to the switch SW11, the mute control signal MUTE is also inputted to the pre-amplifier 310A. The switch SW11 is turned on in a period in which the mute control signal MUTE is asserted (high level). Moreover, in a period of the mute control signal MUTE is asserted (high level), the pre-amplifier 310A fixes the output voltage Vin at a predetermined voltage level Vcom. The predetermined voltage level Vcom may be set to a center level of the input voltage Vin.

In FIG. 5, the pre-amplifier 310A is an inverting amplifier, and includes an operational amplifier 312, and resistors R21 and R22. A predetermined voltage Vcom is inputted to the non-inverting input terminal of the operational amplifier 312, and a center level of the output Vin of the pre-amplifier 310A is the voltage Vcom of the non-inverting input terminal.

In this example, the mute control signal MUTE is inputted to the operational amplifier 312. The operational amplifier 312 is configured to fix the voltage level of the output voltage Vin at the bias voltage Vbias in a period in which the mute control signal MUTE is asserted.

Moreover, in the pre-amplifier 310A, the mechanism or configuration for fixing the output Vin at the predetermined voltage level Vcom in the mute period is not specifically defined. The pre-amplifier 310A may also include a switch disposed and connected in parallel with the resistor R22. The switch is turned on in the mute period in which the mute control signal MUTE is asserted, and so the operational amplifier 312 functions as a voltage follower. Thus, the voltage level of the input voltage Vin may be fixed at the predetermined voltage level Vcom.

Figure 6:
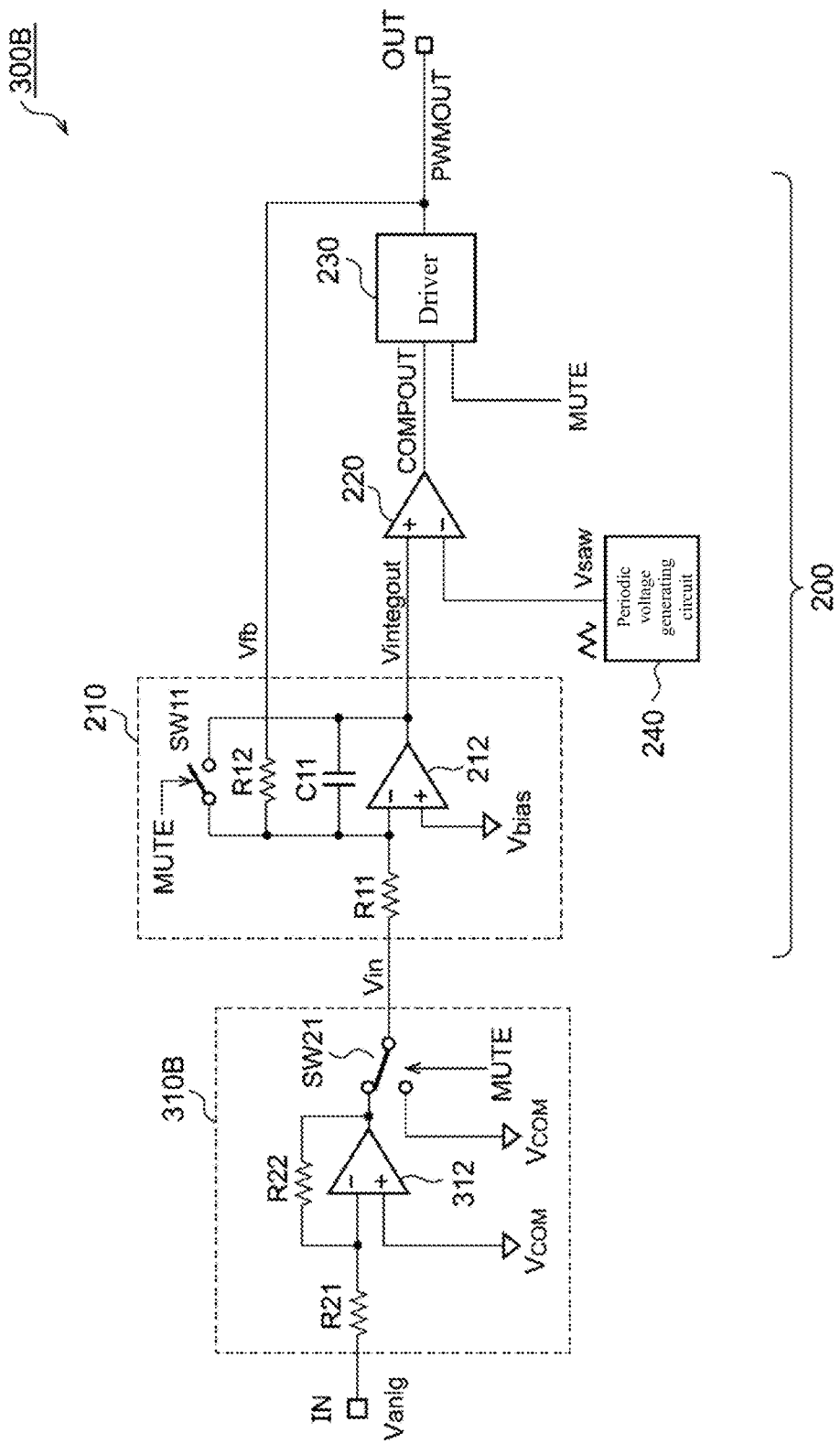
FIG. 6 is a circuit diagram of an audio circuit according to a second embodiment.

FIG. 6 shows a circuit diagram of an audio circuit 300B according to a second embodiment. A pre-amplifier 310B includes a selector SW21. The output voltage of the operational amplifier 312 and the predetermined voltage level Vcom are inputted to the selector SW21. The switch SW11 is turned on in a period in which the mute control signal MUTE is asserted (high level). Moreover, the selector SW21 selects the predetermined voltage level Vcom in a period in which the mute control signal MUTE is asserted, and selects the output voltage of the operational amplifier 312 in a period in which the mute control signal MUTE is negated.

In FIG. 5 and FIG. 6, the pre-amplifier 310 is set as an inverting amplifier; however, the pre-amplifier 310 may also be a non-inverting amplifier.

Figure 7:
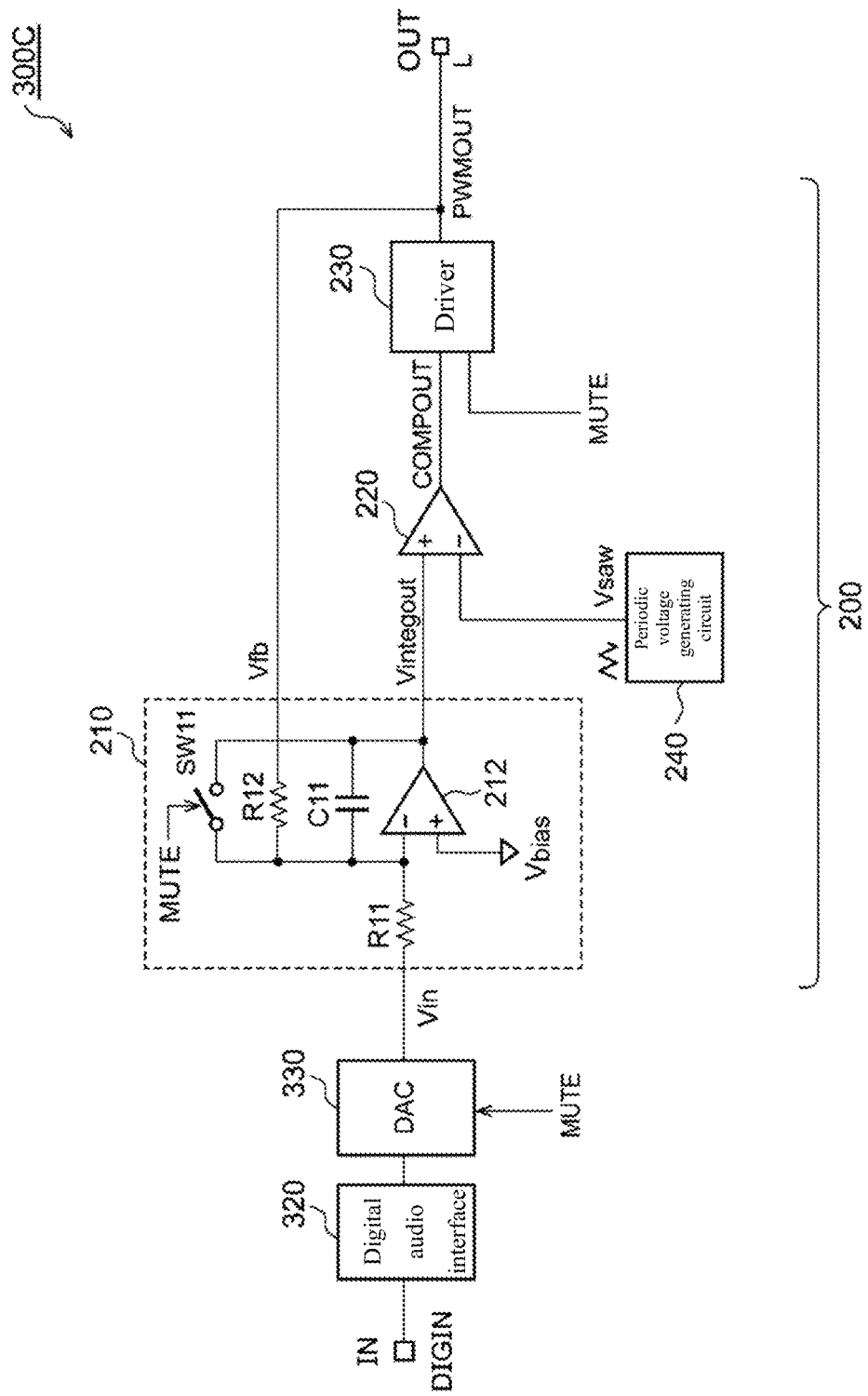
FIG. 7 is a circuit diagram of an audio circuit according to a third embodiment.

FIG. 7 shows a circuit diagram of an audio circuit 300C according to a third embodiment. The audio circuit 300C includes a digital audio interface 320 and a digital-to-analog converter (DAC) 330 in substitution for the pre-amplifier 310. The digital audio interface 320 receives a digital audio signal DIGIN from an external acoustic source. The DAC 330 converts the digital audio signal DIGIN received by the digital audio interface 320 to an analog audio signal Vin, and provides the analog audio signal Vin to the class D amplifier circuit 200.

The mute control signal MUTE is inputted to the DAC 330. The switch SW11 is turned on in a period in which the mute control signal MUTE is asserted (high level). Moreover, the DAC 330 fixes a voltage level of the output Vin thereof to the predetermined voltage Vcom in a period in which the mute control signal MUTE is asserted.

Figure 8:
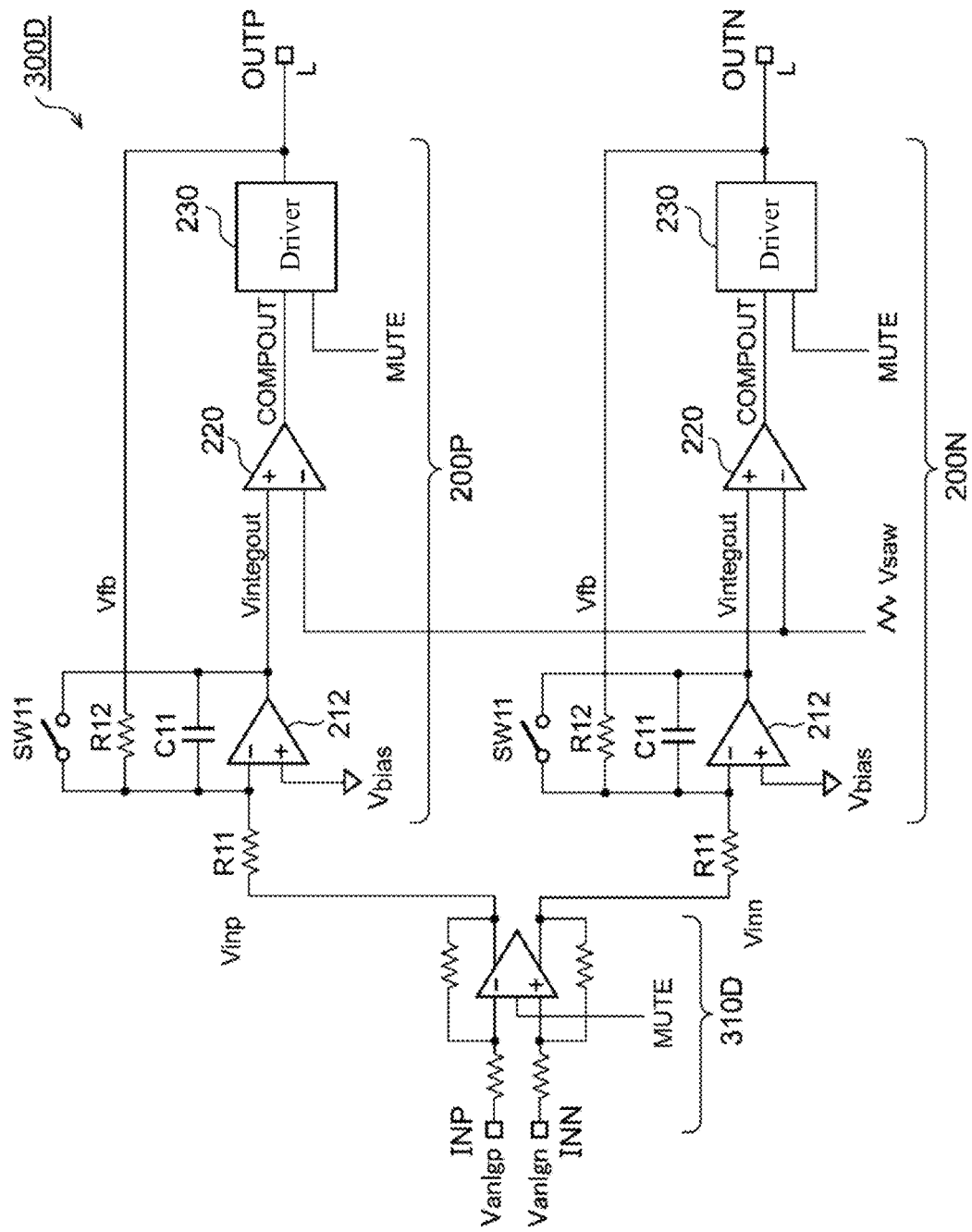
FIG. 8 is a circuit diagram of an audio circuit according to a fourth embodiment.

FIG. 8 shows a circuit diagram of an audio circuit 300D according to a fourth embodiment. The audio circuit 300D includes two class D amplifier circuits 200P and 200N, and a pre-amplifier 310D. The class D amplifier circuits 200P and 200N are connected to an electroacoustic conversion element (not shown) by means of bridge-tied load (BTL).

Differential analog audio signals Vanlgp and Vanlgn are inputted to input terminals INP and INN of the audio circuit 300D. The pre-amplifier 310D amplifies the differential analog audio signals Vanlgp and Vanlgn, and provides the amplified voltages Vinp and Vinn to the class D amplifier circuits 200P and 200N. The mute control signal MUTE is inputted to the pre-amplifier 310D, and the pre-amplifier 310D fixes the output voltages Vinp and Vinn thereof as the predetermined voltage level Vcom when the mute control signal MUTE is asserted.

A DAC having differential outputs may also be disposed in substitution for the pre-amplifier 310D. In this case, the DAC receives the mute control signal MUTE and fixes the differential outputs Vinp and Vinn of the DAC as the predetermined voltage level Vcom in the mute period.

In the description above, a configuration of only one channel is illustrated; however, the audio circuit may be a dual-channel or multi-channel configuration, and in this case, the audio circuit includes class D amplifier circuits 200 corresponding to the number of the channels.

Purposes

Figure 9:
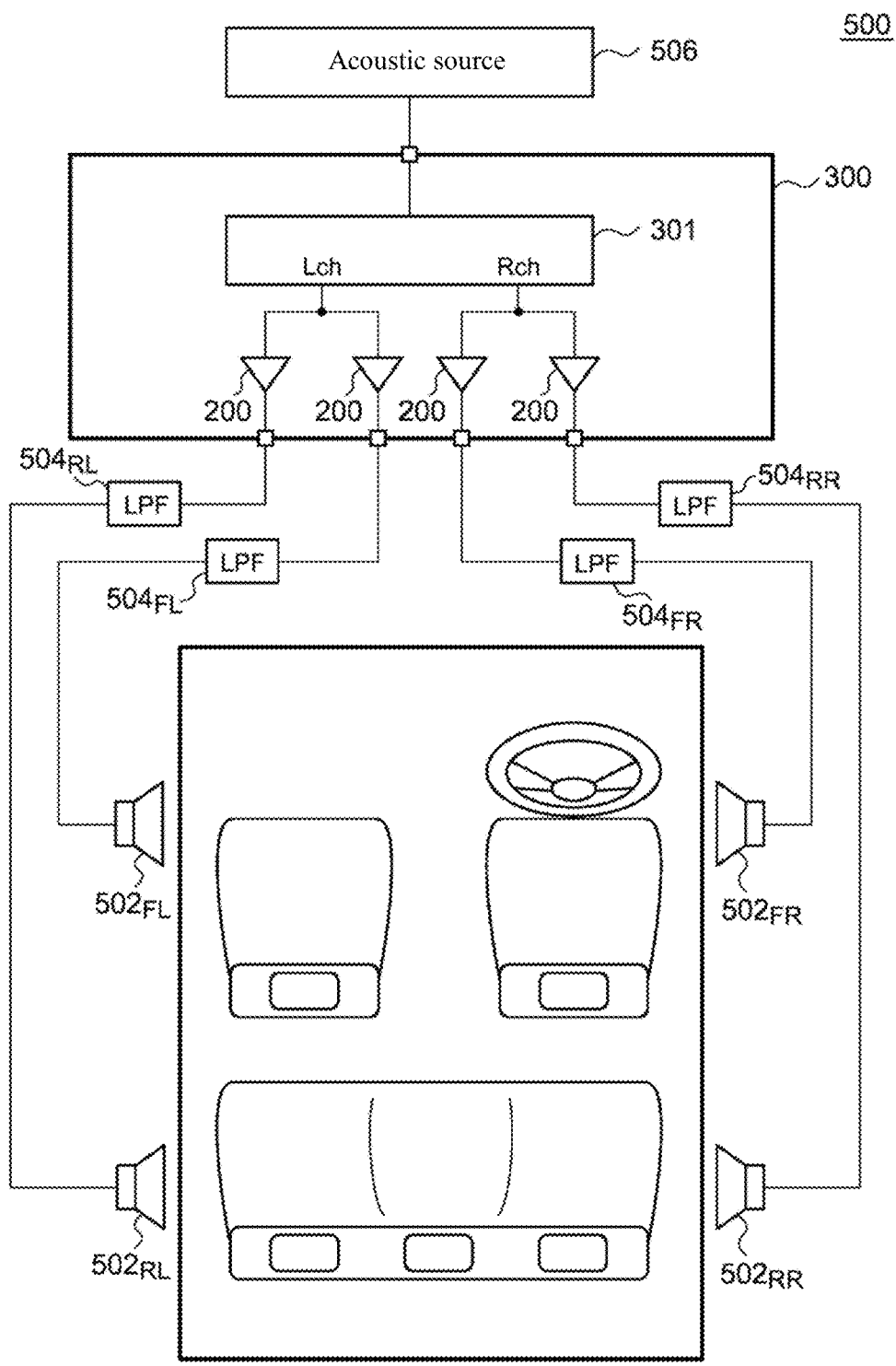
FIG. 9 is a block diagram of a vehicle audio system using an audio circuit according to an embodiment.

The purposes of the audio circuit 300 are to be described below. FIG. 9 shows a block diagram of a vehicle audio system using an audio circuit according to an embodiment.

A vehicle audio system 500 includes four speakers $502_{FL}$, $502_{FR}$, $502_{RL}$ and $502_{RR}$, four filters $504_{FL}$, $504_{FR}$, $504_{RL}$ and $504_{RR}$, an acoustic source 506 and an audio circuit 300.

The acoustic source 506 outputs left/right (LR) dual-channel or multi-channel digital or analog audio signals. The audio circuit 300 includes four channels of class D amplifier circuits 200 and an interface circuit 301 for the acoustic source 506. The interface circuit 301 is the pre-amplifier 310 in FIG. 5 and FIG. 6, or may be established with correspondence with the digital audio interface 320 and the DAC 330 in FIG. 7.

The filters 504, the acoustic source 506 and the audio circuit 300 are built in an audio head unit or a vehicle navigation device. Alternatively, the audio circuit 300 may be a product independent of the acoustic source 506.

Figure 10A:
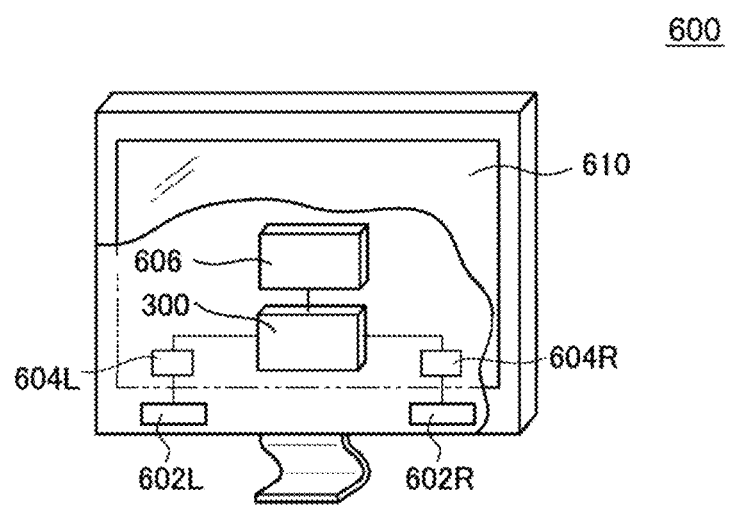
FIG. 10A and FIG. 10B are diagrams of electronic devices using an audio circuit according to an embodiment.
Figure 10B:
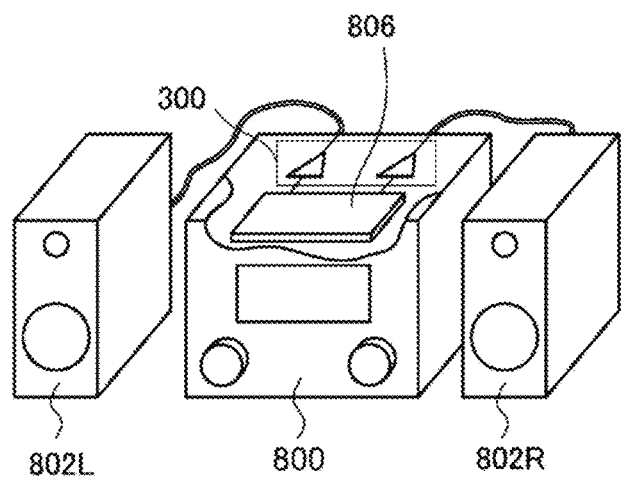

FIG. 10A and FIG. 10B show diagrams of electronic devices using an audio circuit according to an embodiment. The electronic device in FIG. 10A is a display device 600 such as a television. The display device 600 includes speakers 602L and 602R, filters 604L and 604R, an acoustic source 606, an audio circuit 300 and a display panel 610.

The electronic device in FIG. 10B is an audio assembly device 800. The audio assembly device 800 includes an audio signal processing circuit 806 equivalent to an acoustic source, an audio circuit 300, and a filter (not shown). The audio circuit 300 drives 802L and 802R connected by speaker cables.

Details of the embodiments of the disclosure are described as above. It should be understood that, the embodiments are exemplary, and different variations may be made to combinations of the constituting elements and processes, and such variations are to be encompassed within the scope of the disclosure.

The invention claimed is:

1. An audio circuit comprising a class D amplifier circuit, the class D amplifier circuit including:
   an output terminal, connected to a filter;
   a bridge circuit, including an output node connected to the output terminal;
   an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted, wherein the input signal is fixed at a predetermined voltage level in the mute period;
   a periodic voltage generating circuit, generating a periodic voltage of a triangular wave or sawtooth wave;
   a comparator, comparing an output of the integrator with the periodic voltage; and
   a driver, switching the bridge circuit according to an output of the comparator in the non-mute period, and fixing an output of the bridge circuit in the mute period; and
   a pre-amplifier disposed on a front end of the class D amplifier circuit, wherein the pre-amplifier fixes its output to the predetermined voltage level in the mute period.

2. The audio circuit of claim 1, wherein the integrator comprises:
   an input node, receiving the input signal;
   an operational amplifier, including a non-inverting input node receiving the bias voltage;
   a first resistor, disposed between the input node and an inverting input node of the operational amplifier;
   a second resistor, disposed between the output terminal and the inverting input node of the operational amplifier;
   a capacitor, disposed between the inverting input node of the operational amplifier and an output node of the operational amplifier; and
   a switch, disposed and connected in parallel with the capacitor, turned off in the non-mute period and turned on in the mute period.

3. The audio circuit of claim 2, wherein the bias voltage is an intermediate voltage between a peak value and a valley value of the periodic voltage.

4. The audio circuit of claim 2, wherein two of the class D amplifier circuit are provided, the two class D amplifier circuits being connected to an electroacoustic conversion element by bridge-tied load (BTL).

5. The audio circuit of claim 2, wherein the audio circuit is integrally integrated on a substrate.

6. The audio circuit of claim 1, wherein the bias voltage is an intermediate voltage between a peak value and a valley value of the periodic voltage.

7. The audio circuit of claim 6, wherein two of the class D amplifier circuit are provided, the two class D amplifier circuits being connected to an electroacoustic conversion element by bridge-tied load (BTL).

8. The audio circuit of claim 6, wherein the audio circuit is integrally integrated on a substrate.

9. The audio circuit of claim 1, further comprising a digital-to-analog converter (DAC) disposed on a front end of the class D amplifier circuit, wherein the DAC fixes its output to the predetermined voltage level in the mute period.

10. The audio circuit of claim 9, wherein two of the class D amplifier circuit are provided, the two class D amplifier circuits being connected to an electroacoustic conversion element by bridge-tied load (BTL).

11. The audio circuit of claim 1, wherein two of the class D amplifier circuit are provided, the two class D amplifier circuits being connected to an electroacoustic conversion element by bridge-tied load (BTL).

12. The audio circuit of claim 1, wherein the audio circuit is integrally integrated on a substrate.

13. An electronic device, comprising the audio circuit of claim 1.

14. A vehicle audio system, comprising:
   a speaker;
   a filter, including an output node connected to the speaker; and
   an audio circuit, comprising:
      an output terminal, connected to the filter;
      a bridge circuit, including an output node connected to the output terminal;
      an integrator, integrating and outputting a difference between an input signal and a feedback signal corresponding to an output signal generated at the output terminal in a non-mute period in which a mute control signal is negated, and outputting a predetermined bias voltage in a mute period in which the mute control signal is asserted, wherein the input signal is fixed at a predetermined voltage level in the mute period;
      a periodic voltage generating circuit, generating a periodic voltage of a triangular wave or sawtooth wave;
      a comparator, comparing an output of the integrator with the periodic voltage; and
      a driver, switching the bridge circuit according to an output of the comparator in the non-mute period, and fixing an output of the bridge circuit in the mute period;
      a pre-amplifier disposed on a front end of the class D amplifier circuit, wherein the pre-amplifier fixes its output to the predetermined voltage level in the mute period.

* * * * *